United States Patent
Ohtake

(10) Patent No.: US 10,340,123 B2
(45) Date of Patent: Jul. 2, 2019

(54) MULTI-FREQUENCY POWER MODULATION FOR ETCHING HIGH ASPECT RATIO FEATURES

(71) Applicant: Tokyo Electron Limited, Minato-ku, Tokyo (JP)

(72) Inventor: Hiroto Ohtake, Hillsboro, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/604,053

(22) Filed: May 24, 2017

(65) Prior Publication Data

US 2017/0345619 A1 Nov. 30, 2017

Related U.S. Application Data

(60) Provisional application No. 62/341,840, filed on May 26, 2016.

(51) Int. Cl.
    *H01J 37/32* (2006.01)
    *H05H 1/46* (2006.01)
    (Continued)

(52) U.S. Cl.
    CPC .. *H01J 37/32165* (2013.01); *H01J 37/32082* (2013.01); *H01L 21/311* (2013.01);
    (Continued)

(58) Field of Classification Search
    None
    See application file for complete search history.

(56) References Cited

U.S. PATENT DOCUMENTS 4,808,258 A * 2/1989 Otsubo ................. C23C 16/517
                                                    156/345.44
4,985,109 A * 1/1991 Otsubo ............. H01J 37/32357
                                                        118/50.1
(Continued)

FOREIGN PATENT DOCUMENTS

JP      10-303188 A     11/1998
JP      2010-532549 A   10/2010
(Continued)

OTHER PUBLICATIONS

Office Action dated Sep. 21, 2018 in corresponding Korean Patent Application No. 10-2017-0065580 (with an English translation) (12 pages).

(Continued)

*Primary Examiner* — Allan W. Olsen
(74) *Attorney, Agent, or Firm* — Rothwell, Figg, Ernst & Manbeck, P.C.

(57) ABSTRACT

A method of etching a substrate is described. The method includes disposing a substrate having a surface exposing a first material and a second material in a processing space of a plasma processing system, and performing a modulated plasma etching process to selectively remove the first material at a rate greater than removing the second material. The modulated plasma etching process includes a power modulation cycle composed of applying a first power modulation sequence to the plasma processing system, and applying a second power modulation sequence to the plasma processing system, the second power modulation sequence being different than the first power modulation sequence.

20 Claims, 5 Drawing Sheets

(51) Int. Cl.
*H01L 21/67* (2006.01)
*H01L 21/311* (2006.01)

(52) U.S. Cl.
CPC ......... *H01L 21/67063* (2013.01); *H05H 1/46* (2013.01); *H01J 2237/334* (2013.01)

(56) References Cited

U.S. PATENT DOCUMENTS

| | | | |
|---|---|---|---|
| 5,287,118 A | 2/1994 | Budd | |
| 6,106,737 A | 8/2000 | Tomoyasu et al. | |
| 6,126,778 A * | 10/2000 | Donohoe | H01J 37/321 118/723 AN |
| 6,129,806 A * | 10/2000 | Kaji | H01J 37/32082 118/723 E |
| 6,432,834 B1 | 8/2002 | Kim | |
| 6,767,838 B1 * | 7/2004 | Ono | C23F 4/00 216/67 |
| 6,794,301 B2 | 9/2004 | Savas | H01J 37/32082 156/345.48 |
| 6,849,191 B2 * | 2/2005 | Ono | C23F 4/00 216/61 |
| 6,875,700 B2 * | 4/2005 | Kanakasabapathy | H01J 37/321 216/67 |
| 6,902,683 B1 * | 6/2005 | Kaji | H01J 37/32082 156/345.47 |
| 7,166,233 B2 | 1/2007 | Johnson et al. | |
| 8,021,723 B2 | 9/2011 | Fukasawa et al. | |
| 8,664,125 B2 * | 3/2014 | Raley | H01J 37/32192 438/305 |
| 8,735,291 B2 | 5/2014 | Ranjan et al. | |
| 8,808,562 B2 * | 8/2014 | Ohsawa | H01L 21/32136 216/58 |
| 9,087,798 B2 * | 7/2015 | Ohtake | H01J 37/32082 |
| 9,159,575 B2 | 10/2015 | Ranjan et al. | |
| 9,355,822 B2 * | 5/2016 | Yamada | H01J 37/32091 |
| 9,373,520 B2 * | 6/2016 | Yoshimura | H01L 21/0273 |
| 9,502,537 B2 * | 11/2016 | Kitamura | H01L 21/31116 |
| 9,570,312 B2 * | 2/2017 | Takeda | H01L 21/67069 |
| 9,570,313 B2 | 2/2017 | Ranjan et al. | |
| 9,711,375 B2 * | 7/2017 | Terauchi | H01J 37/32183 |
| 2002/0066537 A1 * | 6/2002 | Ogino | H01J 37/32192 156/345.44 |
| 2002/0115301 A1 * | 8/2002 | Savas | H01J 37/32082 438/710 |
| 2002/0139658 A1 * | 10/2002 | Kanakasabapathy | H01J 37/321 204/164 |
| 2006/0278524 A1 | 12/2006 | Stowell | |
| 2008/0110859 A1 | 5/2008 | Koshiishi et al. | |
| 2009/0001890 A1 | 1/2009 | Singh et al. | |
| 2009/0004836 A1 | 1/2009 | Singh et al. | |
| 2009/0255800 A1 * | 10/2009 | Koshimizu | H01J 37/32091 204/164 |
| 2010/0248489 A1 * | 9/2010 | Koguchi | H01J 37/32091 438/714 |
| 2011/0100954 A1 * | 5/2011 | Satake | C23F 4/00 216/22 |
| 2012/0052689 A1 | 3/2012 | Tokashiki | |
| 2012/0064726 A1 | 3/2012 | Nozawa et al. | |
| 2013/0029492 A1 * | 1/2013 | Inoue | H01J 37/32192 438/719 |
| 2014/0020831 A1 * | 1/2014 | Ohgoshi | H01L 21/67069 156/345.28 |
| 2014/0148016 A1 * | 5/2014 | Kanazawa | H01J 37/32146 438/714 |
| 2014/0305905 A1 * | 10/2014 | Yamada | H01J 37/32091 216/71 |
| 2014/0361690 A1 * | 12/2014 | Yamada | H01J 37/32091 315/111.21 |
| 2015/0000841 A1 * | 1/2015 | Yamada | H01J 37/32183 156/345.28 |
| 2015/0044877 A1 * | 2/2015 | Ohtake | H01J 37/32082 438/714 |
| 2015/0122421 A1 * | 5/2015 | Konno | H01J 37/32165 156/345.28 |
| 2015/0371876 A1 * | 12/2015 | Terauchi | H01J 37/32183 438/710 |
| 2016/0079037 A1 * | 3/2016 | Hirano | H01J 37/32146 156/345.28 |
| 2017/0330764 A1 * | 11/2017 | Lai | H01J 37/32146 |

FOREIGN PATENT DOCUMENTS

| | | |
|---|---|---|
| JP | 2012-54534 A | 3/2012 |
| JP | 2012-84872 A | 4/2012 |
| JP | 2016-66593 A | 4/2016 |
| KR | 2001-0009811 A | 2/2001 |
| KR | 10-2009-0057088 A | 6/2009 |
| KR | 10-2013-0085955 A | 7/2013 |
| WO | 2011/156813 A1 | 12/2011 |
| WO | 2012/035842 A1 | 3/2012 |

OTHER PUBLICATIONS

Office Action dated Nov. 30, 2018 in corresponding Taiwan Patent Application No. 106117335 (with an English translation) (8 pages).
Notice of Reasons for Rejection dated Jul. 3, 2018 in corresponding Japanese Patent Application No. 2017-103423 (with an English translation) (9 pages).

* cited by examiner

MULTI-FREQUENCY POWER MODULATION FOR ETCHING HIGH ASPECT RATIO FEATURES

CROSS REFERENCE TO RELATED APPLICATIONS

This application claims the benefit of U.S. Provisional Patent Application No. 62/341,840, filed on May 26, 2016, entitled "MULTI-FREQUENCY POWER MODULATION FOR ETCHING HIGH ASPECT RATIO FEATURES", which is incorporated herein by reference in its entirety.

FIELD OF INVENTION

The invention relates to a method for selectively etching one material on a substrate relative to another material on the substrate using plasma.

DESCRIPTION OF RELATED ART

The need to remain competitive in cost and performance in the production of semiconductor devices has caused a continuous increase in device density of integrated circuits. To accomplish higher integration and miniaturization in a semiconductor integrated circuit, miniaturization of a circuit pattern formed on a semiconductor wafer must also be accomplished.

Plasma etching is a standard technique used to manufacture semiconductor integrated circuitry by transferring geometric shapes and patterns from a lithographic mask to underlying layers of a semiconductor wafer. With increasing aspect ratios and more complex materials, the need for state-of-the-art etching processes that meet selectivity and profile control requirement is becoming increasingly critical.

SUMMARY OF THE INVENTION

Embodiments of the invention relate to a method for selectively etching one material on a substrate relative to another material on the substrate using plasma.

According to one embodiment, a method of etching a substrate is described. The method includes disposing a substrate having a surface exposing a first material and a second material in a processing space of a plasma processing system, and performing a modulated plasma etching process to selectively remove the first material at a rate greater than removing the second material. The modulated plasma etching process includes a power modulation cycle composed of applying a first power modulation sequence to the plasma processing system, and applying a second power modulation sequence to the plasma processing system, the second power modulation sequence being different than the first power modulation sequence.

DETAILED DESCRIPTION OF SEVERAL EMBODIMENTS

Figure 1A:
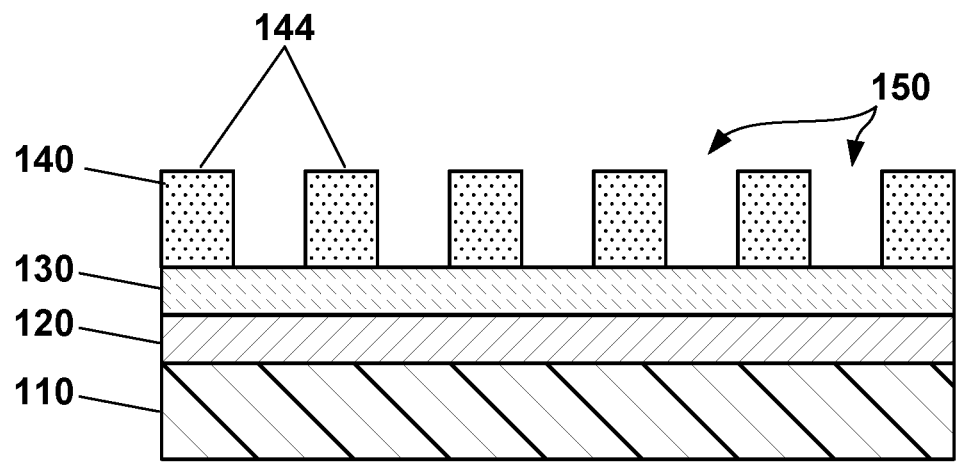
FIGS. 1A and 1B illustrate a schematic representation of a patterning sequence on a substrate.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

During pattern etching, a dry plasma etching process can be utilized, wherein plasma is formed from a process gas by coupling electromagnetic (EM) energy, such as radio frequency (RF) power, to the process gas in order to heat electrons and cause subsequent ionization and dissociation of the atomic and/or molecular constituents of the process gas. Furthermore, the coupling of electromagnetic energy can be used to control the energy level of charged species incident on the exposed substrate surface. Through control of various plasma properties, including charged specie density, charged specie flux, charged specie energy, chemical flux, etc., a desired end result for the plasma etching process can be achieved according to embodiments described herein. In particular, embodiments are provided that achieve target etch selectivity, profile control, and substrate charging control.

As described above, materials, typically employed in semiconductor device manufacturing, are selectively removed relative to one another using modulated plasma etching. Referring now to the drawings, wherein like reference numerals designate identical or corresponding parts throughout the several views, FIGS. 1A, 1B, 2, and 3 illustrate a method for etching a material on a microelectronic workpiece according to an embodiment. The method is pictorially illustrated in FIGS. 1A and 1B, and presented by way of a flow chart 200 in FIG. 2. As presented in FIG. 2, the flow chart 200 begins in 212 with disposing a substrate 110 having a surface exposing a first material (130) and a second material (140) in a processing space of a plasma processing system.

As shown in FIG. 1A, the substrate 110 can include a patterned layer 140 overlying a film stack, including one or more layers 120, 130 to be etched or patterned. The patterned layer 140 can define an open feature pattern 150 overlying one or more additional layers. The substrate 110 further includes device layers. The device layers can include any thin film or structure on the substrate into which a pattern is to be transferred, or a target material is to be removed.

Layers 130 and 140 can be any material utilized in the manufacture of electronic devices, including semiconductor devices, electro-mechanical devices, photovoltaic devices, etc. However, to selectively etch one layer (e.g., layer 130 of a first material) relative to another layer (e.g., layer 140 of a second material), the material composition of the two layers is inherently different, such that each layer exhibits a different etch resistance when exposed to an etchant. Layers 130, 140 can be organic or inorganic materials. Layers 130, 140 can be silicon-containing material, germanium-containing material, carbon-containing material, or metal-containing material. For example, silicon-containing materials can include amorphous silicon (a-Si), polycrystalline silicon (poly-Si), single crystal silicon, doped silicon, silicon oxide (SiOx), silicon nitride (SiNy), silicon carbide (SiCz), silicon oxynitride (SiOxNy), silicon oxycarbide (SiOxCz), silicon-germanium alloy (SixGe1-x), etc. Metal-containing materials can include a metal, a metal alloy, a transition metal (e.g., Ti, Ta, W, Ru, Co, Ni, Hf, etc.), transition metal oxide (e.g., titanium oxide (TiOx)), transition metal nitride (e.g., titanium nitride (TiNy)), carbides, chalcogenides, etc. Layers 130, 140 can include organic resists, anti-reflective coatings, or planarization layers, or silicon-containing resists, anti-reflective coatings, or planarization layers with varying degrees of silicon content. The above materials may be deposited using vapor deposition techniques, or spin-on deposition techniques.

Figure 1B:
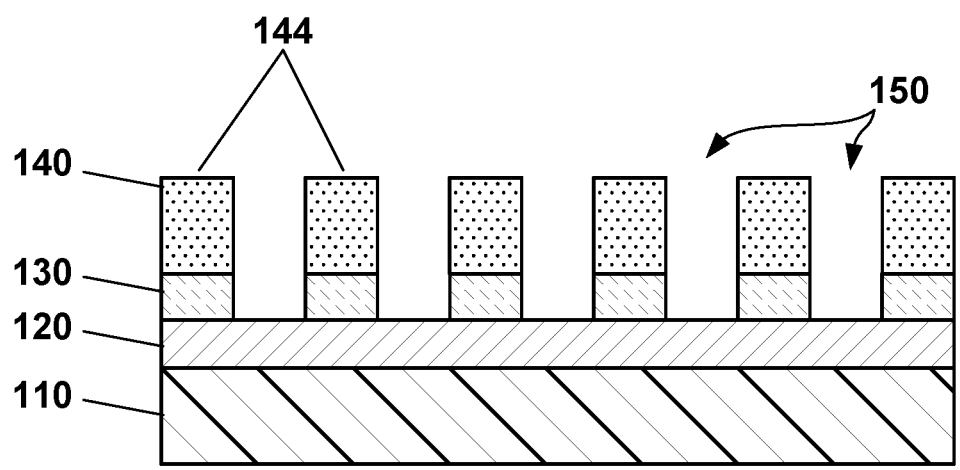
Figure 2:
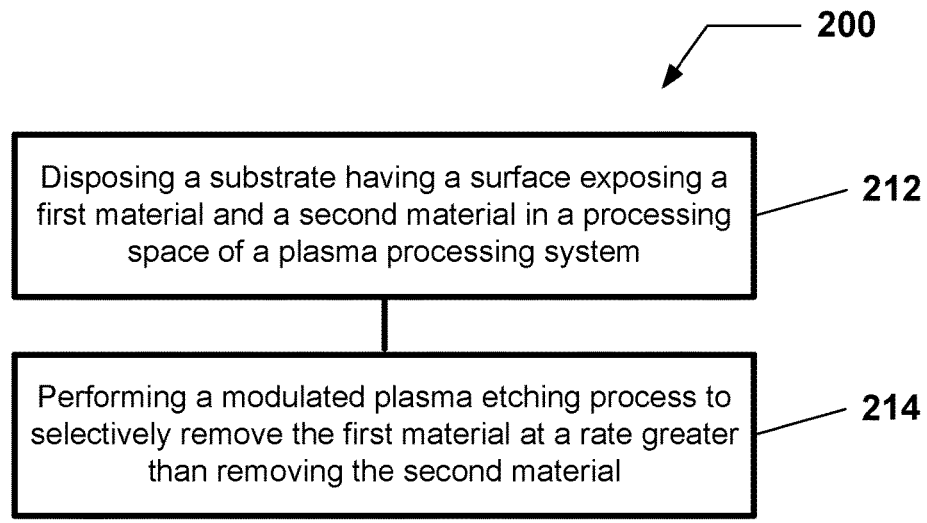
FIG. 2 provides a flow chart illustrating a method of etching a substrate according to an embodiment.

In FIG. 1B and in 214 of FIG. 2, the open feature pattern 150 overlying one or more additional layers is extended into layer 130 by performing a modulated plasma etching process to selectively remove the first material (130) at a rate greater than removing the second material (140).

Figure 3:
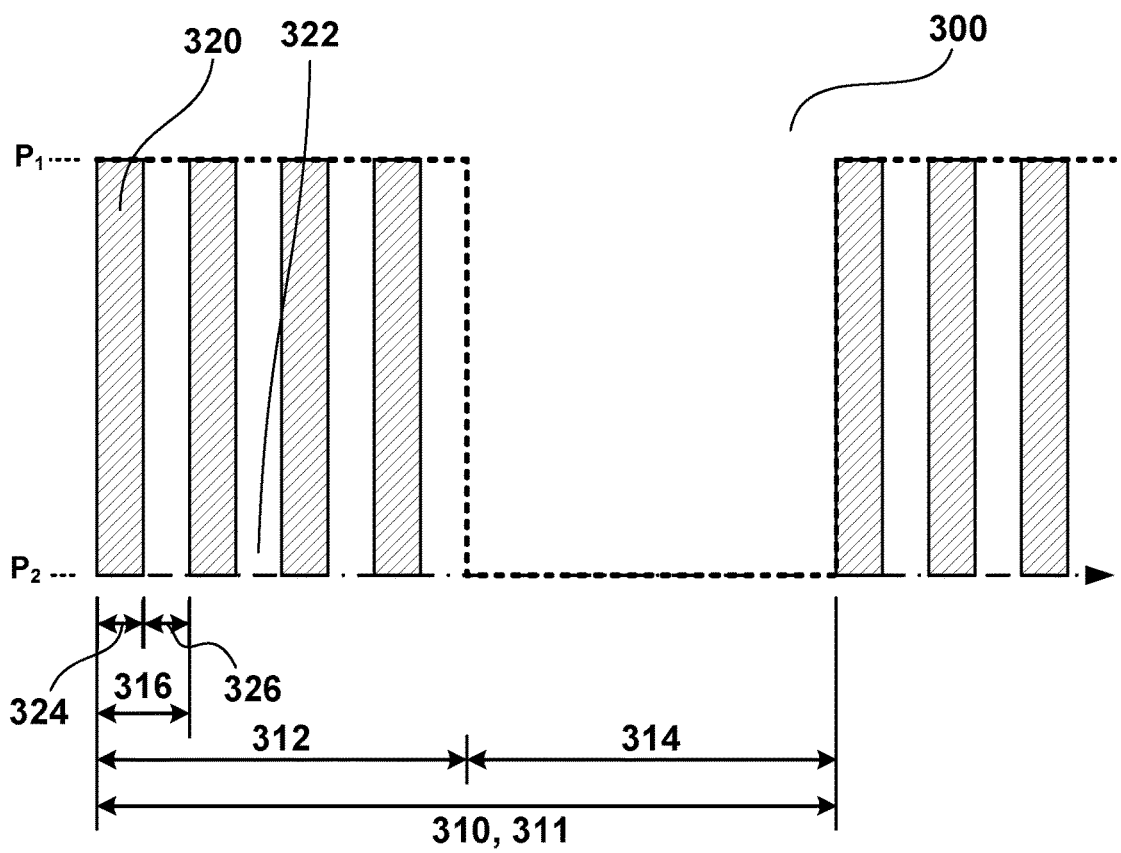
FIG. 3 depicts a multi-frequency power modulation cycle according to an embodiment.
Figure 4:
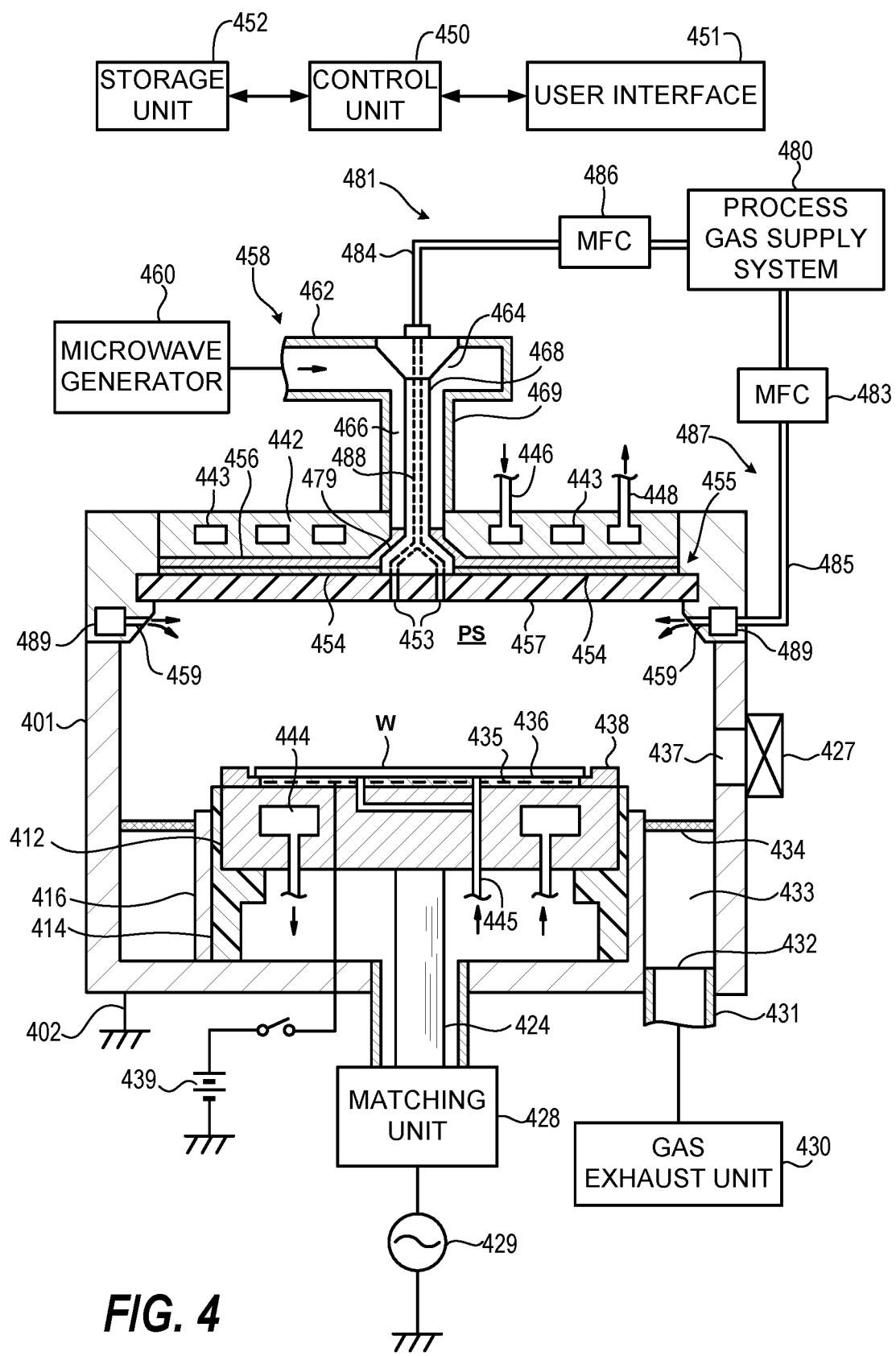
FIG. 4 shows a schematic representation of a plasma processing system according to an embodiment.
Figure 5:
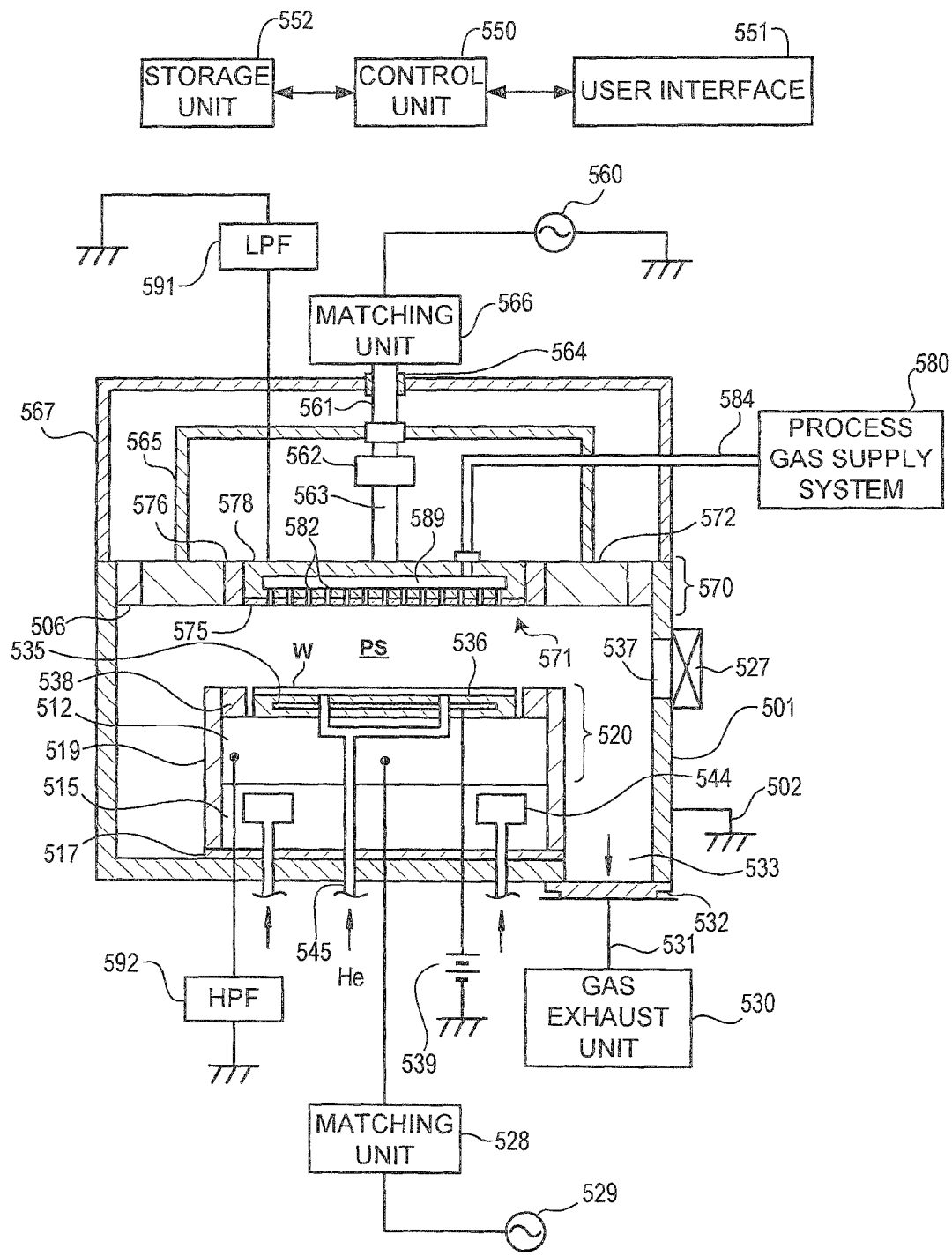
FIG. 5 shows a schematic representation of a plasma processing system according to another embodiment.
Figure 6:
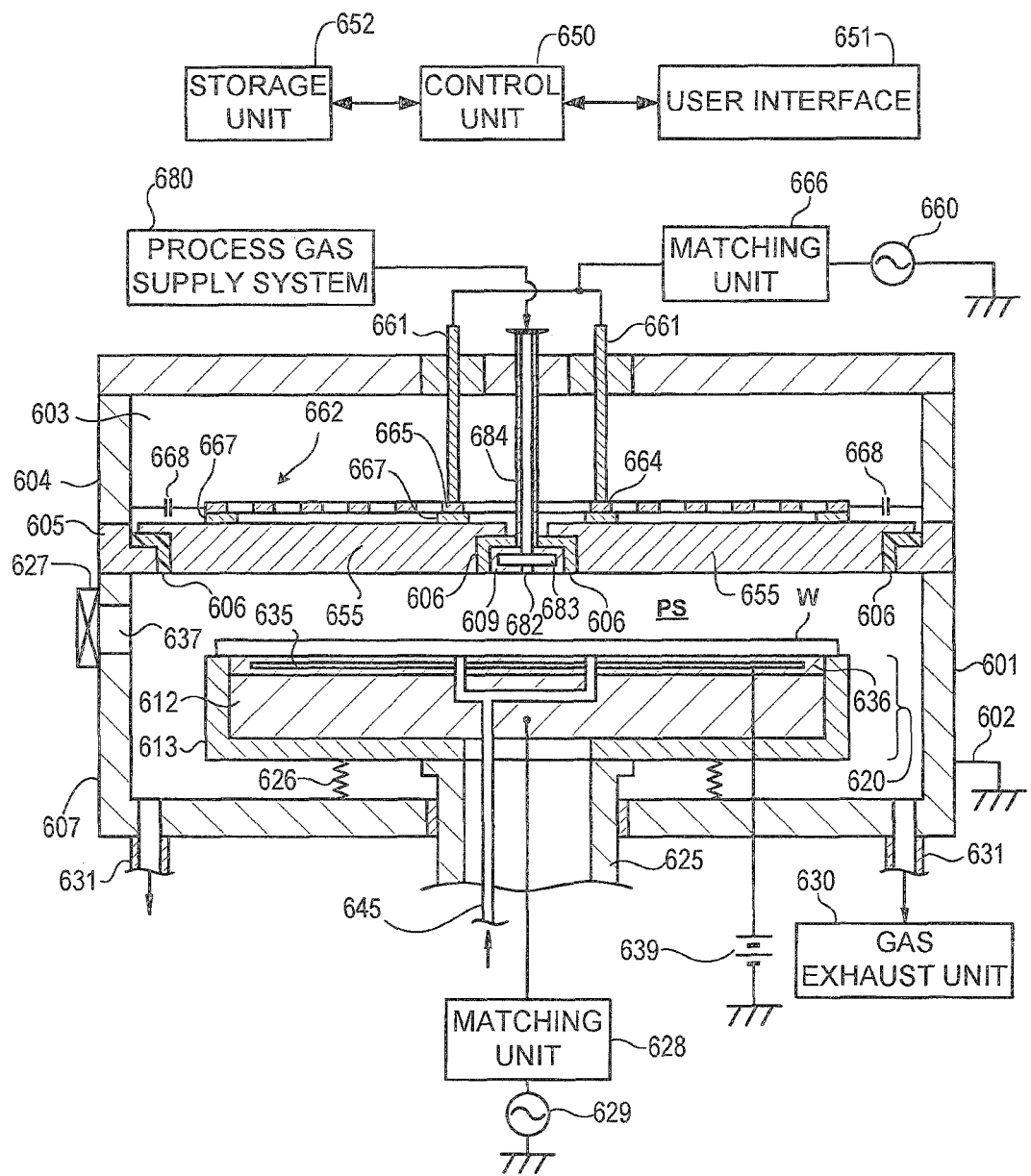
FIG. 6 shows a schematic representation of a plasma processing system according to yet another embodiment.

Referring now to FIG. 3, a modulated plasma etching process 300 is illustrated. In one embodiment, the modulated plasma etching process 300 includes modulation of the radio frequency (RF) power delivered to a substrate holder or susceptor upon which the substrate is positioned. The substrate holder can position the substrate facing an RF powered electrode, such as a capacitive coupling element or inductive coupling element (to be described below). Alternatively, the substrate holder can position the substrate facing a slotted plane antenna, wherein power at a microwave frequency is coupled to the slotted plane antenna, for example. Exemplary systems are depicted in FIGS. 4 through 6. While the modulation of the RF power delivered to the substrate holder or susceptor is described, it can alternatively be coupled to other power coupling elements in the plasma processing system.

As shown in FIG. 3, the modulated plasma etching process 300 includes a power modulation cycle 310 that is composed of applying a first power modulation sequence 312 to the plasma processing system, and applying a second power modulation sequence 314 to the plasma processing system, the second power modulation sequence 314 being different than the first power modulation sequence 312.

As necessary to complete the modulated plasma etching process 300 to meet target specifications, the power modulation cycle 310 is repeated at least one more cycle, wherein each modulation cycle includes a modulation period. The power modulation cycle 310 can include a periodic modulation cycle. As shown in FIG. 3, the power modulation cycle 310 can be repeated at a power modulation frequency, represented as modulation period 311, for a determined modulation time period (equivalent to one or more modulation periods), wherein the first power modulation sequence 312 includes repeating a first sub-power modulation cycle 316 at a first sub-power modulation frequency (or first sub-power modulation period). In particular, the first sub-power modulation cycle 316 includes: applying a radio frequency (RF) signal to the plasma processing system at a first power level 320, and applying the RF signal to the plasma processing system at a second power level 322, wherein the first and second power levels 320, 322 differ in value from one another.

In one example, the power modulation frequency is less than 1 kHz, and the first sub-power modulation frequency is greater than or equal to 1 kHz. In another example, the power modulation frequency is less than 500 Hz, and the first sub-power modulation frequency is greater than or equal to 500 Hz. In yet another example, the power modulation frequency is less than 100 Hz, and the first sub-power modulation frequency is greater than or equal to 100 Hz. The threshold frequency can vary depending on the process.

As shown in FIG. 3, the first power level 320 exceeds the second power level 322. And, in some embodiments, the second power level 322 is a power off state. In other embodiments, the RF signal is applied to the plasma processing system at an intermediate power level, wherein the intermediate power level resides at a value between the first and second power levels 320, 322.

The RF signal is applied at the first RF power level for a first sub-time duration 324, and the RF signal is applied at the second RF power level for a second sub-time duration 326. For example, the first sub-time duration 324, during which the RF signal is applied at the first power level 320, can range from 10% to 90% of the time period of the first sub-power modulation cycle 316. In another example, the first sub-time duration 324 can range from 40% to 60% of the time period of the first sub-power modulation cycle 316 (e.g., 50% duty cycle).

As shown in FIG. 3, the second power modulation sequence 314 can consist of a power off state. Alternatively, the second power modulation sequence 314 consists of applying the RF signal at a constant power level.

In alternative embodiments (not shown), the second power modulation sequence 314 can include repeating a second sub-power modulation cycle at a second sub-power modulation frequency, wherein the second sub-power modulation cycle includes: applying the radio frequency (RF) signal to the plasma processing system at a third power level, and applying the RF signal to the plasma processing system at a fourth power level, wherein the third and fourth power levels differ in value from one another. The second sub-power modulation frequency can be greater than or equal to 1 kHz. The third power level can exceed the fourth power level, and the fourth power level can include a power off state.

The inventors surmise that the relatively high frequency nature of first power modulation sequence 312 reduces surface charging and improves vertical profile of the feature being etched. And, the relatively low frequency nature of the power modulation cycle 310 enhances the exhausting of etch byproduct and reduces feature clogging.

During the modulated plasma etching process, at least one property of the modulation cycle may be adjusted. The at least one property may include a power amplitude, a modulation frequency, a modulation duty cycle, a modulation waveform, or a modulation phase (relative to other modulated properties, such as gas flow, source and/or bias power, etc.).

In one embodiment, the modulated plasma etching process may comprise a process parameter space that includes: a chamber pressure ranging up to about 1000 mtorr (millitorr) (e.g., up to about 200 mtorr, or up to about 50 to 150 mtorr), a halogen-containing gas flow rate ranging up to about 2000 sccm (standard cubic centimeters per minute) (e.g., up to about 1000 sccm, or about 1 sccm to about 200 sccm), a polymerizing gas flow rate ranging up to about 2000 sccm (e.g., up to about 1000 sccm, or about 1 sccm to about 100 sccm), an optional noble gas (e.g., He or Ar) flow rate ranging up to about 2000 sccm (e.g., up to about 1000 sccm), an upper electrode/antenna power ranging up to about 2000-to-5000 W (watts) (e.g., up to about 1000 W, or up to about 600 W), and a lower electrode power ranging up to about 1000-to-2000 W (e.g., up to about 600 W, or up to about 100 W, or up to 50 W). Also, the upper electrode/anntenna frequency can range from about 0.1 MHz to about 3 GHz. In addition, the lower electrode RF frequency can range from about 0.1 MHz to about 100 MHz, e.g., about 2 MHz.

One or more of the methods for etching a substrate described above may be performed utilizing a plasma processing system, such as the one the systems described in FIGS. 4 through 6. However, the methods discussed are not to be limited in scope by this exemplary presentation. The method of etching a substrate according to various embodiments described above may be performed in other plasma processing systems not specifically described below. Furthermore, various componentry described in FIGS. 4 through 6 can be utilized, replaced with, or complemented by other componentry not described. While one or more RF or microwave power sources of various electromagnetic frequency are described, multiple sources above, below, or surrounding the substrate W are contemplated.

FIG. 4 is a schematic cross-sectional view of a microwave plasma processing apparatus in accordance with embodiments herein. The microwave plasma processing apparatus can be configured to perform plasma processing, such as plasma etching, plasma enhanced chemical vapor deposition (PECVD), plasma enhanced atomic layer deposition (PEALD), etc., via surface wave plasma excitation at microwave frequencies using, for example, a flat, plate-type slot antenna. Plasma processing can be executed within processing chamber 401, which can be a cylindrical vacuum chamber composed of a machined or cast metal, such as aluminum or stainless steel. The processing chamber 401 is electrically grounded using, for example, ground wire 402. The processing chamber 401 defines a processing vessel providing a process space PS for plasma generation. An inner wall of the processing vessel can be coated with a protective barrier, such as alumina, yttria, or other protectant.

At a lower, central area within the processing chamber 401, a susceptor 412 (which can be disc-shaped) can serve as a mounting table on which, for example, a substrate W to be processed (such as a semiconductor wafer) can be mounted. Substrate W can be moved into the processing chamber 401 through loading/unloading port 437 and gate valve 427. An electrostatic chuck 436 is provided on a top surface of the susceptor 412. Clamp electrode 435 is electrically connected to DC (direct current) power source 439. The electrostatic chuck 436 attracts the substrate W thereto via an electrostatic force generated when a DC voltage from the DC power source 439 is applied to the clamp electrode 435 so that substrate W is securely mounted on the susceptor 412.

A high-frequency power source 429 for applying a RF (radio frequency) bias is electrically connected to the susceptor 412, or bias electrode through an impedance matching unit 428 (to match impedance or minimize reflected power) and a power feeding rod 424. The high-frequency power source 429 can output a high-frequency voltage in a range from, for example, 0.2 MHz to 20 MHz, e.g., 13.56 MHz. Applying a high frequency bias power attracts ions, generated by the plasma in the processing chamber 401, to substrate W. Power source 429 can include a signal generator and amplifier for modulating the amplitude and power output from the power source 429 according to the modulation cycle described above. A focus ring 438 is provided radially outside the electrostatic chuck 436 to surround the substrate W.

A coolant flow path 444 can extend, for example, in a circumferential direction, within susceptor 412 and can be configured to receive circulated coolant to assist with controlling a processing temperature of substrate W on the electrostatic chuck 436. Additionally, a heat transfer gas from a heat transfer gas supply unit (not illustrated) can be supplied to a space between a top surface of the electrostatic chuck 436 and a rear surface of the substrate W through a gas supply line 445.

An exhaust path 433 can be formed along an outer periphery of support unit 414 and/or conductive support unit 416 and an inner wall of the processing chamber 401 in which an annular baffle plate 434 is attached to the top or inlet of the exhaust path 433 and an exhaust port 432 (or multiple exhaust ports), which is provided in a bottom portion of the exhaust path 433. A gas exhaust unit 430 is connected to each exhaust port 432 through gas exhaust line 431, which can have multiple exhaust lines. The gas exhaust unit 430 can include a vacuum pump such as a turbo molecular pump configured to decompress the plasma processing space within the processing chamber 401 to a desired vacuum condition.

An upper portion of the microwave plasma processing apparatus will now be described. A dielectric window 457 is arranged to seal an upper portion of the processing chamber 401, through which electromagnetic radiation at microwave frequencies can propagate to the process space PS. A space just below the dielectric window 457 within the processing chamber 401 serves as a plasma generation space as process space PS. The dielectric window 457 can be made of a microwave-permeable dielectric material, such as quartz or ceramic, including aluminum oxide, and can have a thickness of, for example, about 20 mm (millimeters) or sufficient thickness to mechanically resist the pressure difference between an interior of the processing chamber 401 and the ambient environment. The dielectric window 457 can be provided with a slot plate 454 which can be a conductor attached to, or disposed on, a top surface of the dielectric window 457. The slot plate 454 can have a plurality of slot pairs that are configured to irradiate microwaves distributed concentrically in a rotationally symmetric arrangement, though other geometric configurations can be used. On the slot plate 454, a dielectric plate 456 can shorten the wavelength of microwaves propagated inside the slot plate 454. The slot plate 454 is electromagnetically coupled to a microwave transmission line 458. A slot antenna 455, which can be a flat plate-type slot antenna, for example, or a disc-shaped, radial line slot antenna, can include the slot plate 454, the dielectric plate 456, and an antenna rear plate (not shown) provided to be opposite to the slot plate 454.

The microwave transmission line 458 is a line configured to propagate or transmit electromagnetic waves at microwave frequencies or other frequencies, for example, microwaves of 2.45 GHz, which are output from a microwave generator 460 at a predetermined power level, to the slot antenna 455. The microwave transmission line 458 can include a waveguide 462, a waveguide-coaxial line converter 464, and a coaxial line 466. The waveguide 462 can be, for example, a rectangular waveguide configured to transmit microwaves from the microwave generator 460 to the waveguide-coaxial line converter 464. The coaxial line 466 extends from the waveguide-coaxial line converter 464 to the central portion of the top of the processing chamber 401 and a terminal end of the coaxial line 466 is coupled to the slot antenna 455 through the dielectric plate 456. An outer conductor 469 and an inner conductor 468 can define a space for wave transmission. A connector unit 479 is connected to the lower end of the inner conductor 468.

In addition, as electromagnetic waves propagate radially through the dielectric plate 456, the wavelength shortens, and the wave mode transitions to plane waves of circular polarization having two orthogonal polarization components from each slot pair of the slot antenna 455 that are radiated toward the inside of the processing chamber 401. Process gas in the vicinity of the surface of the dielectric window 457 is then ionized by the electric fields of surface waves (microwave electric fields) propagated in the radial direction along the surface of the dielectric window 457 and, as a result, high-density and low-electronic temperature plasma is generated.

The dielectric plate 456 can include a cooling jacket plate 442, which can serve as an antenna rear plate to cover a top of the processing chamber 401. The cooling jacket plate 442 can be configured to absorb heat (radiating) of dielectric loss, which is generated from the dielectric window 457 and the dielectric plate 456. To provide cooling, a coolant can be circulated in a flow path 443, and fed and removed through conduit 446 and conduit 448.

The microwave plasma processing apparatus can include two routes for process gas introduction. Upper gas introduction section 481 includes a gas flow path provided in the dielectric window 457, and a side gas introduction section 487 that includes a gas flow path provided in a side wall of the processing chamber 401, as a gas introduction mechanism configured to introduce a processing gas into the processing chamber 401.

In the upper gas introduction section 481, a gas flow path 488 is provided in the inner conductor 468 of the coaxial line 466 to extend in an axial direction through the inside of the inner conductor 468. Additionally, a first gas supply line 484 from a process gas supply system 480 is connected to the upper end of the inner conductor 468 and the gas flow path 488 of the first gas supply line 484. The connector unit 479 can have a plurality of internal flow paths which are bored and radially branched from a common inlet. The connector unit 479 can be made of a conductor, and can be electrically grounded. The dielectric window 457 can be formed with inner flow paths connected to the terminal ends of a branched gas supply paths such as for process gas to vertically pass through the dielectric window 457 to face the plasma generation space within the processing chamber 401.

In the upper gas introduction section 481, a processing gas, which is communicated from the process gas supply system 480 at a predetermined pressure (for example, an etching gas or a film-forming gas), flows through the first gas supply line 484, the gas flow path 488 of the coaxial line 466, and is ejected from each gas jet port 453 at the terminal end. A mass flow controller (MFC) 486 and corresponding valve can be used for opening/closing and metering process gas flow in first gas supply line 484.

In the upper gas introduction section 481, a processing gas, which is communicated from the process gas supply system 480 at a predetermined pressure (for example, an etching gas or a film-forming gas), flows through the first gas supply line 484, the gas flow path 488 of the coaxial tube 466, and is ejected from each gas jet port 453 at the terminal end. A mass flow controller (MFC) 486 and corresponding valve can be used for opening/closing and metering process gas flow in first gas supply line 484.

The side gas introduction section 487 is placed at a position lower than a bottom surface of the dielectric window 457, and can include a buffer chamber 489 (manifold), sidewall gas jet ports 459, and a second gas supply line 485 extending from the process gas supply system 480 to the buffer chamber 489. A mass flow controller 483 and corresponding valve can be used for opening/closing and metering process gas flow in second gas supply line 485. Process gas from side gas introduction section 487 can be jetted in a substantially horizontal flow from the respective sidewall gas jet ports 459 to be diffused in the process space PS.

Components of the plasma processing apparatus can be connected to, and controlled by, a control unit 450, which in turn can be connected to a corresponding storage unit 452 and user interface 451. Control unit 450 can include a microcomputer configured to control operation of each of the components within the microwave plasma processing apparatus such as, for example, the gas exhaust unit 430, the high-frequency power source 429, DC power source 439 for the electrostatic chuck 436, microwave generator 460, the upper gas introduction section 481, the side gas introduction section 487, the process gas supply system 480, and a heat transfer gas supply unit (not illustrated) or the operations of the entire apparatus. Various plasma processing operations can be executed via the user interface 451, and various plasma processing recipes and operations can be stored in the storage unit 452. Accordingly, a given substrate can be processed within the plasma processing chamber with various microfabrication techniques.

FIG. 5 is a schematic cross-sectional view of a capacitively coupled plasma processing apparatus in accordance with embodiments herein. This apparatus can be used for multiple operations including ashing, etching, deposition, cleaning, plasma polymerization, plasma-enhanced chemical vapor deposition (PECVD), and so forth. Plasma processing can be executed within processing chamber 501, which can be a vacuum chamber composed of a metal, such as aluminum or stainless steel. The processing chamber 501 is grounded using, for example, a ground wire 502. The processing chamber 501 defines a processing vessel providing a process space PS for plasma generation. An inner wall of the processing vessel can be coated with alumina, yttria, or other protectant. The processing vessel can be cylindrical in shape, or have other geometric configurations.

At a lower, central area within the processing chamber 501, a susceptor 512 (which can be disc-shaped) can serve as a mounting table on which, for example, a substrate W to be processed (such as a semiconductor wafer) can be mounted. Substrate W can be moved into the processing chamber 501 through loading/unloading port 537 and gate valve 527. Susceptor 512 forms part of a lower electrode 520 (lower electrode assembly) as an example of a second electrode acting as a mounting table for mounting substrate W thereon. Specifically, the susceptor 512 is supported on a susceptor support 515, which is provided at substantially a central region of a bottom portion of processing chamber 501 via an insulating plate 517. The susceptor support 515 can be cylindrical. The susceptor 512 can be formed of an aluminum alloy, for example.

Susceptor 512 can be provided with an electrostatic chuck 536 (as part of the lower electrode assembly) for holding the substrate W. The electrostatic chuck 536 is provided with a clamp electrode 535. Clamp electrode 535 is electrically connected to DC (direct current) power source 539. The electrostatic chuck 536 attracts the substrate W thereto via an electrostatic force generated when a DC voltage from the DC power source 539 is applied to the clamp electrode 535 so that substrate W is securely mounted on the susceptor 512. A high-frequency power source 529 for applying a RF (radio frequency) bias is electrically connected to the susceptor 512, or bias electrode through an impedance matching unit 528 (to match impedance or minimize reflected power). The high-frequency power source 529 (a second power source) can output a high-frequency voltage in a range from, for example, 0.2 MHz to 20 MHz. Applying a high frequency bias power attracts ions, generated by the plasma in the processing chamber 501, to substrate W. Power source 529 can include a signal generator and amplifier for modulating the amplitude and power output from the power source 529 according to the modulation cycle described above. A focus ring 538 is provided radially outside the electrostatic chuck 536 to surround the substrate W.

An inner wall member 519, which can be cylindrical and formed of quartz, for example, can be attached to the outer peripheral side of the electrostatic chuck 536 and susceptor support 515. The susceptor support 515 includes a coolant flow path 544 (for flowing chilled or heated fluid). The coolant flow path 544 communicates with a chiller unit (not shown), installed outside the processing chamber 501. Coolant flow path 544 is supplied with coolant (cooling or heating liquid, such as water or dielectric fluid) circulating through corresponding lines. Accordingly, a temperature of the substrate W mounted on/above the susceptor 512 can be accurately controlled. A gas supply line 545, which passes through the susceptor 512 and the susceptor support 515, is configured to supply heat transfer gas to an upper surface of the electrostatic chuck 536. A heat transfer gas (also known as backside gas), such as helium (He), can be supplied between the substrate W and the electrostatic chuck 536 via the gas supply line 545 to assist in heating substrate W.

An exhaust path 533 can be formed along an outer periphery of inner wall member 519 and an inner sidewall surface of the processing chamber 501. An exhaust port 532 (or multiple exhaust ports) is provided in a bottom portion of the exhaust path 533. A gas exhaust unit 530 is connected to each exhaust port via gas exhaust line 531. The gas exhaust unit 530 can include a vacuum pump such as a turbo molecular pump configured to decompress the plasma processing space within the processing chamber 501 to a desired vacuum condition. The gas exhaust unit 530 evacuates the inside of the processing chamber 501 to thereby depressurize an inner pressure thereof up to a desired degree of vacuum.

An upper electrode 570 (that is, an upper electrode assembly), is an example of a first electrode that is positioned vertically above the lower electrode 520 to face the lower electrode 520 (as parallel plate electrodes, for example). The plasma generation space, or process space PS, is defined between the lower electrode 520 and the upper electrode 570. The upper electrode 570 can include an inner upper electrode 571 having a disk shape, for example, and an outer upper electrode 572 having an annular shape, for example, that surrounds a periphery of the inner upper electrode 571. The inner upper electrode 571 also functions as a processing gas inlet for injecting a specific amount of processing gas into the process space PS above substrate W mounted on the lower electrode 520. The upper electrode 570 thereby forms a shower head.

More specifically, the inner upper electrode 571 includes electrode plate 575 (which is typically circular) having gas injection openings 582. Inner upper electrode 571 also includes an electrode support 578 detachably supporting an upper side of the electrode plate 575. The electrode support 578 can be formed in the shape of a disk having substantially the same diameter as the electrode plate 575 (when electrode plate 575 is embodied as circular in shape). In alternative embodiments, electrode plate 575 can be square, rectangular, polygonal, etc. The electrode plate 575 can be formed of a conductor or semiconductor material, such as Si, SiC, doped Si, aluminum, and so forth. The electrode plate 575 can be integral with upper electrode 570, or detachably supported by electrode support 578 for convenience in replacing a given plate after surface erosion. The upper electrode 570 can also include a cooling plate or cooling mechanism (not shown) to control temperature of the electrode plate 575.

The electrode support 578 can be formed of, e.g., aluminum, and can include a buffer chamber 589. Buffer chamber 589 is used for diffusing process gas and can define a disk-shaped space. Processing gas from a process gas supply system 580 supplies gas to the upper electrode 570. The process gas supply system 580 can be configured to supply a processing gas for performing specific processes, such as film-forming, etching, and the like, on the substrate W. The process gas supply system 580 is connected with a gas supply line 584 forming a processing gas supply path. The gas supply line 584 is connected to the buffer chamber 589 of the inner upper electrode 571. The processing gas can then move from the buffer chamber 589 to the gas injection openings 582 at a lower surface thereof. A flow rate of processing gas introduced into the buffer chamber 589 can be adjusted using a mass flow controller, for example. Further, the processing gas introduced is uniformly discharged from the gas injection openings 582 of the electrode plate 575 (showerhead electrode) to the process space PS. The inner upper electrode 571 then functions in part to provide a showerhead electrode assembly.

A dielectric 576, having a ring shape, can be interposed between the inner upper electrode 571 and the outer upper electrode 572. An insulator 506, which can be a shield member having a ring shape and being formed of, e.g., alumina, is interposed between the outer upper electrode 572 and an inner peripheral wall of the processing chamber 501 in an air tight manner.

The outer upper electrode 572 is electrically connected with a high-frequency power source 560 (first high-frequency power source) via a power feeder 565, an upper power feed rod 561, and a matching unit 566. The high-frequency power source 560 can output a high-frequency voltage having a frequency of 40 MHz (megahertz) or higher (e.g., 60 MHz), or can output a very high frequency (VHF) voltage having a frequency of 3-300 MHz. This power source can be referred to as the main power supply as compared to a bias power supply. The power feeder 565 can be formed into a substantially cylindrical shape, for example, having an open lower surface. The power feeder 565 can be connected to the outer upper electrode 572 at the lower end portion thereof. The power feeder 565 is electrically connected with the lower end portion of the upper power feed rod 561 at the center portion of an upper surface thereof. The upper power feed rod 561 is connected to the output side of the matching unit 566 at the upper end portion thereof. The matching unit 566 is connected to the high-frequency power source 560 and can match load impedance with the internal impedance of the high-frequency power source 560. Note, however, that outer upper electrode 572 is optional and embodiments can function with a single upper electrode.

Power feeder 565 can be covered on an outside thereof by a ground conductor 567, which can be cylindrical having a sidewall whose diameter is substantially the same as that of the processing chamber 501. The ground conductor 567 is connected to the upper portion of a sidewall of the processing chamber 501 at the lower end portion thereof. The upper power feed rod 561 passes through a center portion of the upper surface of the ground conductor 567. An insulating member 564 is interposed at the contact portion between the ground conductor 567 and the upper power feed rod 561.

The electrode support 578 is electrically connected with a lower power feed rod 563 on the upper surface thereof. The lower power feed rod 563 is connected to the upper power feed rod 561 via a connector. The upper power feed rod 561 and the lower power feed rod 563 form a power feed rod for supplying high-frequency electric power from the high-frequency power source 560 to the upper electrode 570. A variable capacitor 562 is provided in the lower power feed rod 563. By adjusting the capacitance of the variable capacitor 562, when the high-frequency electric power is applied from the high-frequency power source 560, the relative ratio of an electric field strength formed directly under the outer upper electrode 572 to an electric field strength formed directly under the inner upper electrode 571 can be adjusted. The inner upper electrode 571 of the upper electrode 570 is electrically connected with a low pass filter (LPF) 591. The LPF 591 blocks or filters high frequencies from the high-frequency power source 560 while passing low frequencies from the high-frequency power source 529 to ground. A lower portion of the system, the susceptor 512, forming part of the lower electrode 520, is electrically connected with a high pass filter (HPF) 592. The HPF 592 passes high frequencies from the high-frequency power source 560 to ground.

Components of the plasma processing apparatus can be connected to, and controlled by, a control unit 550, which in turn can be connected to a corresponding storage unit 552 and user interface 551. Various plasma processing operations can be executed via the user interface 551, and various plasma processing recipes and operations can be stored in storage unit 552. Accordingly, a given substrate can be processed within the plasma processing chamber with various microfabrication techniques. In operation, the plasma processing apparatus uses the upper and lower electrodes to generate a plasma in the processing space PS. This generated plasma can then be used for processing a target substrate (such as substrate W or any material to be processed) in various types of treatments such as plasma etching, chemical vapor deposition, treatment of glass material and treatment of large panels such as thin-film solar cells, other photovoltaic cells, and organic/inorganic plates for flat panel displays, etc.

High-frequency electric power in a range from about 3 MHz to 300 MHz, is applied from the high-frequency power source 560 to the upper electrode 570. A high-frequency electric field is generated between the upper electrode 570 and the susceptor 512 or lower electrode. Processing gas delivered to process space PS can then be ionized and dissociated to form a reactive plasma. A low frequency electric power in a range from about 0.2 MHz to 20 MHz can be applied from the high-frequency power source 529 to the susceptor 512 forming the lower electrode. In other words, a dual or tri-frequency system can be used. As a result, ions in the plasma are attracted toward the susceptor 512 with sufficient energy to anisotropically etch features via ion assistance. Note that for convenience, FIG. 5 shows the high-frequency power source 560 supplying power to the upper electrode 570. In Alternative embodiments, the high-frequency power source 560 can be supplied to the lower electrode 520. Thus, both main power (energizing power) and the bias power (ion acceleration power) can be supplied to the lower electrode.

FIG. 6 is a schematic cross-sectional view of an inductively coupled plasma processing apparatus in accordance with embodiments herein. This apparatus can be used for multiple operations including ashing, etching, deposition, cleaning, plasma polymerization, plasma-enhanced chemical vapor deposition (PECVD), and so forth. Plasma processing can be executed within processing chamber 601, which can be a vacuum chamber composed of a metal, such as aluminum or stainless steel. The processing chamber 601 is grounded using, for example, a ground wire 602. The processing chamber 601 defines a processing vessel providing a process space PS for plasma generation. An inner wall of the processing vessel can be coated with alumina, yttria, or other protectant. The processing vessel can be cylindrical in shape, or have other geometric configurations.

At a lower, central area within the processing chamber 601, a susceptor 612 (which can be disc-shaped) can serve as a mounting table on which, for example, a substrate W to be processed (such as a semiconductor wafer) can be mounted. Substrate W can be moved into the processing chamber 601 through loading/unloading port 637 and gate valve 627. Susceptor 612 forms part of a lower electrode 620 (lower electrode assembly) as an example of a second electrode acting as a mounting table for mounting substrate W thereon. Specifically, the susceptor 612 is supported on a susceptor support 625, which is provided at substantially a central region of a bottom portion of processing chamber 601. The susceptor support 625 can be cylindrical. The susceptor 612 can be formed of an aluminum alloy, for example.

Susceptor 612 can be provided with an electrostatic chuck 636 (as part of the lower electrode assembly) for holding the substrate W. The electrostatic chuck 636 is provided with a clamp electrode 635. Clamp electrode 635 is electrically connected to DC (direct current) power source 639. The electrostatic chuck 636 attracts the substrate W thereto via an electrostatic force generated when a DC voltage from the DC power source 639 is applied to the clamp electrode 635 so that substrate W is securely mounted on the susceptor 612.

The susceptor 612 can include an insulating frame 613 and be supported by susceptor support 625, which can include an elevation mechanism. The susceptor 612 can be vertically moved by the elevation mechanism during loading and/or unloading of the substrate W. A bellows 626 can be disposed between the insulating frame 613 and a bottom portion of the processing chamber 601 to surround support 625 as an airtight enclosure. Susceptor 612 can include a temperature sensor and a temperature control mechanism, including a coolant flow path (for flowing chilled or heated fluid), a heating unit such as a ceramic heater or the like (all not shown) that can be used to control a temperature of the substrate W. The coolant flow path communicates with a chiller unit (not shown), installed outside the processing chamber 601. Coolant flow path is supplied with coolant (cooling or heating liquid, such as water or dielectric fluid) circulating through corresponding lines. A focus ring (not shown), can be provided on an upper surface of the susceptor 612 to surround the electrostatic chuck 636 and assist with directional ion bombardment.

A gas supply line 645, which passes through the susceptor 612, is configured to supply heat transfer gas to an upper surface of the electrostatic chuck 636. A heat transfer gas (also known as backside gas), such as helium (He) can be supplied between the substrate W and the electrostatic chuck 636 via the gas supply line 645 to assist in heating substrate W.

A gas exhaust unit 630, including a vacuum pump and the like, can be connected to a bottom portion of the processing chamber 601 through gas exhaust line 631. The gas exhaust unit 630 can include a vacuum pump, such as a turbo molecular pump, configured to decompress the plasma processing space within the processing chamber 601 to a desired vacuum condition during a given plasma processing operation.

The plasma processing apparatus can be partitioned into an antenna chamber 603 and a processing chamber 601 by a window 655. Window 655 can be a dielectric material, such as quartz, or a conductive material, such as metal. For embodiments in which the window 655 is metal, the window 655 can be electrically insulated from processing chamber 601, e.g., insulators 606. In this example, the window 655 forms a ceiling of the processing chamber 601. In some embodiments, window 655 can be divided into multiple sections, with these sections optionally insulated from each other.

Provided between sidewall 604 of the antenna chamber 603 and sidewall 607 of the processing chamber 601 is a support shelf 605 projecting toward the inside of the processing apparatus. A support member 609 serves to support window 655 and also functions as a shower housing for supplying a processing gas. When the support member 609 serves as the shower housing, a gas channel 683, extending in a direction parallel to a working surface of a substrate W to be processed, is formed inside the support member 609 and communicates with gas injection openings 682 for injecting process gas into the process space PS. A gas supply line 684 is configured to be in communication with the gas channel 683. The gas supply line 684 defines a flow path through the ceiling of the processing chamber 601, and is connected to a process gas supply system 680 including a processing gas supply source, a valve system and the corresponding components. Accordingly, during plasma processing, a given process gas can be injected into the process space PS.

In antenna chamber 603, a high-frequency antenna 662 (radio frequency) is disposed above the window 655 so as to face the window 655, and can be spaced apart from the window 655 by a spacers 667 made of an insulating material. High-frequency antenna 662 can be formed in a spiral shape or formed in other configurations.

During plasma processing, a high frequency power having a frequency ranging from a few MHz to hundreds of MHz, e.g., 13.56 MHz, to generate an inductive electric field can be supplied from a high-frequency power source 660 to the high-frequency antenna 662 via power feed members 661. A matching unit 666 (impedance matching unit) can be connected to high-frequency power source 660. The high-frequency antenna 662 in this example can have corresponding power feed portion 664 and power feed portion 665 connected to the power feed members 661, as well as additional power feed portions depending on a particular antenna configuration. Power feed portions can be arranged at similar diametrical distances and angular spacing. Antenna lines can extend outwardly from power feed portion 664 and power feed portion 665 (or inwardly depending on antenna configuration) to an end portion of antenna lines. End portions of antenna lines can be connected to the capacitors 668, and the antenna lines are grounded via the capacitors 668. Capacitors 668 can include one or more variable capacitors.

With a given substrate mounted within processing chamber 601, one or more plasma processing operations can be executed. By applying high frequency power to the high-frequency antenna 662, an inductive electric field is generated in the processing chamber 601, and processing gas supplied from the gas injection openings 682 is excited to form plasma in the presence of electrons heated by the inductive electric field. The plasma can then be used to process a given substrate, such as performing processes for etching, ashing, depositing, etc.

A high-frequency power source 629 for applying a RF (radio frequency) bias is electrically connected to the susceptor 612, or bias electrode through an impedance matching unit 628 (to match impedance or minimize reflected power). The high-frequency power source 629 (a second power source) can output a high-frequency voltage in a range from, for example, 0.2 MHz to 20 MHz, e.g., 3.2 MHz. Applying a high frequency bias power attracts ions, generated by the plasma in the processing chamber 601, to substrate W. Power source 629 can include a signal generator and amplifier for modulating the amplitude and power output from the power source 629 according to the modulation cycle described above.

Components of the plasma processing apparatus can be connected to, and controlled by, a control unit 650, which in turn can be connected to a corresponding storage unit 652 and user interface 651. Various plasma processing operations can be executed via the user interface 651, and various plasma processing recipes and operations can be stored in storage unit 652. Accordingly, a given substrate can be processed within the plasma processing chamber with various microfabrication techniques.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of etching, comprising:
    disposing a substrate having a surface exposing a first material and a second material in a processing space of a plasma processing system;
    performing a modulated plasma etching process to selectively remove the first material at a rate greater than removing the second material, the modulated plasma etching process comprising a power modulation cycle that includes:
        applying a first power modulation sequence to the plasma processing system, and
        applying a second power modulation sequence to the plasma processing system, the second power modulation sequence being different than the first power modulation sequence; and
    repeating the power modulation cycle at a power modulation frequency for a determined modulation time period,
    wherein the first power modulation sequence includes repeating a first sub-power modulation cycle at a first sub-power modulation frequency, the first sub-power modulation cycle including:
        applying a radio frequency (RF) signal to the plasma processing system at a first power level, and
        applying the RF signal to the plasma processing system at a second power level, wherein the first and second power levels differ in value from one another;
    wherein a time period of the second power modulation sequence is greater than a time period of the first sub-power modulation cycle.

2. The method of claim 1, wherein the power modulation frequency is less than 1 kHz.

3. The method of claim 2, wherein the first sub-power modulation frequency is greater than or equal to 1 kHz.

4. The method of claim 1, wherein the first power level exceeds the second power level, and the step of applying the RF signal at the first power level occurs before the step of applying the RF signal at the second power level.

5. The method of claim 4, wherein the second power level is a power off state.

6. The method of claim 1, wherein the first sub-power modulation cycle further includes:
    applying the RF signal to the plasma processing system at an intermediate power level, wherein the intermediate power level resides at a value between the first and second power levels.

7. The method of claim 6, wherein the first power level exceeds the second power level, and the step of applying the RF signal at the first power level occurs before the step of applying the RF signal at the second power level.

8. The method of claim 7, wherein the second power level is a power off state.

9. The method of claim 1, wherein the applying the RF signal at the first power level ranges from 10% to 90% of the time period of the first sub-power modulation cycle.

10. The method of claim 1, wherein the second power modulation sequence consists of a power off state.

11. The method of claim 1, wherein the second power modulation sequence consists of applying the RF signal at a constant power level.

12. The method of claim 1, wherein the second power modulation sequence includes repeating a second sub-power modulation cycle at a second sub-power modulation frequency, the second sub-power modulation cycle including:
    applying the radio frequency (RF) signal to the plasma processing system at a third power level, and
    applying the RF signal to the plasma processing system at a fourth power level, wherein the third and fourth power levels differ in value from one another.

13. The method of claim 12, wherein the second sub-power modulation frequency is greater than or equal to 1 kHz.

14. The method of claim 12, wherein the third power level exceeds the fourth power level.

15. The method of claim 14, wherein the fourth power level is a power off state.

16. The method of claim 1, wherein performing the power modulation cycle includes:
    generating a signal waveform to execute the first and second power modulation sequences; and
    amplifying the RF signal according to the generated signal waveform.

17. The method of claim 1, wherein the RF signal is applied to a substrate holder upon which the substrate is positioned.

18. The method of claim 17, wherein the substrate holder positions the substrate facing an RF powered electrode.

19. The method of claim 17, wherein the substrate holder positions the substrate facing a slotted plane antenna.

20. The method of claim 19, wherein power at a microwave frequency is coupled to the slotted plane antenna.

* * * * *